(12) United States Patent
Tzeng et al.

(10) Patent No.: US 7,166,912 B2
(45) Date of Patent: Jan. 23, 2007

(54) ISOLATED THERMAL INTERFACE

(75) Inventors: Jing-Wen Tzeng, Brunswick, OH (US); Daniel Witold Krassowski, Columbia Station, OH (US)

(73) Assignee: Advanced Energy Technology Inc., Lakewood, OH (US)

( * ) Notice: Subject to any disclaimer, the term of this patent is extended or adjusted under 35 U.S.C. 154(b) by 0 days.

(21) Appl. No.: 09/826,676

(22) Filed: Apr. 5, 2001

(65) Prior Publication Data

US 2002/0163076 A1 Nov. 7, 2002

(51) Int. Cl.
*H01L 23/34* (2006.01)

(52) U.S. Cl. .................. 257/712; 257/717; 427/249.6

(58) Field of Classification Search ............... 257/712, 257/706, 702, 675, 705, 717; 438/122; 427/249.6
See application file for complete search history.

(56) References Cited

U.S. PATENT DOCUMENTS

| | | | | |
|---|---|---|---|---|
| 3,404,061 A * | 10/1968 | Shane et al. | ............... | 428/143 |
| 4,455,334 A * | 6/1984 | Ogino et al. | ............... | 428/34.1 |
| 4,611,813 A * | 9/1986 | Guerrero | ............... | 277/314 |
| 4,867,235 A * | 9/1989 | Grapes et al. | ............... | 257/712 |
| 4,878,152 A * | 10/1989 | Sauzade et al. | ............... | 361/386 |
| 4,895,713 A * | 1/1990 | Greinke et al. | ............... | 423/448 |
| 5,270,902 A * | 12/1993 | Bellar et al. | ............... | 361/718 |
| 5,288,054 A * | 2/1994 | Bake et al. | ............... | 251/171 |
| 5,650,592 A * | 7/1997 | Cheskis et al. | ............... | 257/702 |
| 5,745,344 A * | 4/1998 | Baska et al. | ............... | 361/705 |
| 5,831,374 A * | 11/1998 | Morita et al. | ............... | 313/46 |
| 5,834,337 A * | 11/1998 | Unger et al. | ............... | 438/122 |
| 5,902,762 A | 5/1999 | Mercuri et al. | ............... | 501/99 |
| 6,027,807 A * | 2/2000 | Inoue et al. | ............... | 428/408 |
| 6,074,585 A * | 6/2000 | Mercuri et al. | ............... | 264/42 |
| 6,075,287 A * | 6/2000 | Ingramham et al. | ............... | 257/706 |
| 6,165,612 A * | 12/2000 | Misra | ............... | 428/344 |
| 6,194,685 B1 * | 2/2001 | Rutherford | ............... | 219/201 |
| 6,262,893 B1 * | 7/2001 | Liu | ............... | 361/704 |
| 2002/0141155 A1 * | 10/2002 | Pinneo | ............... | 361/688 |

FOREIGN PATENT DOCUMENTS

WO 9935196 7/1999

OTHER PUBLICATIONS

McKeown et al., High Performance Heat Sink for Surface Mount Applications. 1991 IEEE. pagges 153-156.*
Norley et al., The Development of a Natural Graphite Heat-Spreader. Seventeenth IEEE Semi-therm Symposium. Mar. 2001. pp. 107-110.*

* cited by examiner

*Primary Examiner*—Douglas W. Owens
(74) *Attorney, Agent, or Firm*—Waddey & Patterson; James R. Cartiglia

(57) ABSTRACT

An isolated thermal interface is presented. The inventive interface includes a flexible graphite sheet having two major surfaces, at least one of the major surfaces coated with a protective coating sufficient to inhibit flaking of the particles of graphite.

23 Claims, 2 Drawing Sheets

ISOLATED THERMAL INTERFACE

TECHNICAL FIELD

The invention relates to an isolated thermal interface for electronic devices, comprising an article formed of a flexible graphite sheet that is sealed to inhibit mechanical and electrical interference potentially caused by the graphite.

BACKGROUND OF THE INVENTION

With the development of more and more sophisticated electronic components, relatively extreme temperatures can be generated. This is clearly true with respect to electronic components capable of increasing processing speeds and higher frequencies, having smaller size and more complicated power requirements, and exhibiting other technological advances. These components include microprocessors and integrated circuits in electronic and electrical components and systems as well as in other devices such as high power optical devices. However, microprocessors, integrated circuits and other sophisticated electronic components typically operate efficiently only under a certain range of threshold temperatures. The excessive heat generated during operation of these components can not only harm their own performance, but can also degrade the performance and reliability of the overall system and can even cause system failure. The increasingly wide range of environmental conditions, including temperature extremes, in which electronic systems are expected to operate, exacerbates these negative effects.

With the increased need for heat dissipation from microelectronic devices caused by these conditions, thermal management becomes an increasingly important element of the design of electronic products. As noted, both performance reliability and life expectancy of electronic equipment are inversely related to the component temperature of the equipment. For instance, a reduction in the operating temperature of a device such as a typical silicon semiconductor can correspond to an exponential increase in the reliability and life expectancy of the device. Therefore, to maximize the life-span and reliability of a component, controlling the device operating temperature within the limits set by the designers is of paramount importance.

One potential way to effectively dissipate heat from an electronic component is by use of a flexible graphite thermal interface—that is, a thermal interface between the heat-generating component and another component such as a heat sink. Because of the anisotropic nature of flexible graphite sheet, it is uniquely effective at dissipating heat from a source, to effectively manage the heat generated in an electronic device or system. However, there is a concern in the electronics industries to which the use of a graphite-based thermal interface is directed that graphite particles can flake off, and the flakes can mechanically (ie., in the same manner as dust particles) and, due to the conductive nature of graphite, electrically interfere with operation of the component and device in which the thermal interface is employed.

One partial solution to this perceived problem is the provision of an "edge-sealed" graphite thermal interface; that is, a graphite-based thermal interface whose edges are sealed using adhesive strips. One drawback to this approach, however, is in the labor-intensive method of manufacture. Also, leaving the top (as opposed to the edges) of the graphite thermal interface uncovered does not fully address the flaking issues that are of concern, and does not address at all the perception that electrical interference is an issue.

What is desired, therefore, is an isolated graphite-based thermal interface, which prevents any possible flaking of the graphite from the interface. A thermal interface which also electrically isolates the thermal interface from the device in which is it employed is preferred.

SUMMARY OF THE INVENTION

An object of the present invention is to provide a thermal interface material that does not exhibit flaking from the edges or major surfaces of the thermal interface material.

It is another object of the present invention to provide a thermal interface material formed of a flexible graphite sheet, where the thermal interface material is sealed (or isolated) such that flaking of graphite and electrical interference are inhibited.

It is still another object of the present invention to provide a flexible graphite thermal interface material effective to dissipate heat from an electronic component, while avoiding any potential mechanical or electrical interference caused by the thermal interface material.

It is yet another object of the present invention to provide a method for producing the inventive thermal interface material, especially on a continuous basis.

These objects and others that will become apparent to the artisan upon review of the following description can be accomplished by providing a thermal interface capable of being mounted to the external surface of a heat source, such as an electronic component, where the thermal interface comprises an anisotropic flexible graphite sheet isolated using a plastic or adhesive material. More specifically, the invention provides an isolated thermal interface comprising a sheet of flexible graphite particles having two major surfaces, at least one of the major surfaces coated with a protective coating sufficient to inhibit flaking of the particles of graphite. The protective coating preferably comprises a thermoplastic material which is advantageously no more than about 0.025 millimeters in thickness. The thermal interface has edge surfaces, and at least one edge surface of the flexible graphite sheet is coated with a protective coating sufficient to inhibit flaking of the particles of graphite. Moreover, a layer of adhesive, such as an acrylic or a latex material, can be interposed between the protective coating and the flexible graphite sheet, at a thickness of no more than about 0.015 millimeters (to be especially practical for thermal dissipation for electronic or electrical devices).

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as basal planes, are linked or bonded together and groups thereof are arranged in crystallites. Highly ordered graphites consist of crystallites of considerable size, the crystallites being highly aligned or oriented with respect to each other and having well ordered carbon layers. In other words, highly ordered graphites have a high degree of preferred crystallite orientation. Graphites possess anisotropic structures and thus exhibit or possess many properties such as thermal conductivity that are highly directional. Briefly, graphites may be characterized as laminated structures of carbon, that is, structures consisting of superposed layers or laminae of carbon atoms joined together by weak van der Waals forces. In considering the graphite structure, two sets of axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers (parallel to the planar direction of the crystal structure of the graphite) or the directions perpendicular to the "c" direction.

As noted above, the bonding forces holding the parallel layers of carbon atoms together are only weak van der Waals forces. Graphites can be treated so that the spacing between the superposed carbon layers or laminae can be appreciably opened up so as to receive, or intercalate, other species between the carbon layers. Upon heating, the intercalated species decompose and volatilize to provide a marked expansion in the direction perpendicular to the layers, that is, in the "c" direction and thus form an expanded graphite structure (also referred to as exfoliated or intumesced graphite) in which the laminar character of the carbon layers is substantially retained.

Graphite flake which has been greatly expanded and more particularly expanded so as to have a final thickness or "c" direction dimension which is up to about 80 or more times the original "c" direction dimension can be formed without the use of a binder into cohesive or integrated articles and flexible graphite sheets of expanded graphite, e.g. webs, papers, strips, tapes, or the like. The formation of graphite particles which have been expanded to have a final thickness or "c" dimension which is up to about 80 or more times the original "c" direction dimension into integrated articles and flexible sheets by compression, without the use of any binding material, is believed to be possible due to the excellent mechanical interlocking, or cohesion, which is achieved between the voluminously expanded graphite particles.

In addition to flexibility, the graphite material, as noted above, has also been found to possess a high degree of anisotropy with respect to thermal conductivity, comparable to the graphite starting material due to orientation of the expanded graphite particles substantially parallel to the opposed faces of the sheet resulting from high compression, e.g. roll pressing. Sheet material thus produced has excellent flexibility, good strength and a very high degree of orientation.

Generally, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is up to about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.02 g/cc to about 2.0 g/cc. The flexible graphite sheet material exhibits an appreciable degree of anisotropy due to the alignment of graphite particles parallel to the major opposed, parallel surfaces of the sheet, with the degree of anisotropy increasing with the force imparted by roll pressing of the sheet material. In roll pressed anisotropic sheet material, the thickness, i.e. the direction perpendicular to the opposed, parallel sheet surfaces, comprises the "c" direction and the directions ranging along the length and width, i.e. along or parallel to the opposed, major surfaces, comprising the "a" directions and the properties of the sheet are very different, by more than an order of magnitude, for the "c" and "a" directions. For instance, the thermal conductivity of flexible graphite sheet varies significantly between the "c" and the "a" directions (i.e., about 2–40 watts per meter-° C. (W/m° C.) vs. about 150–500 W/m° C.).

DETAILED DESCRIPTION OF THE INVENTION

Figure 1:
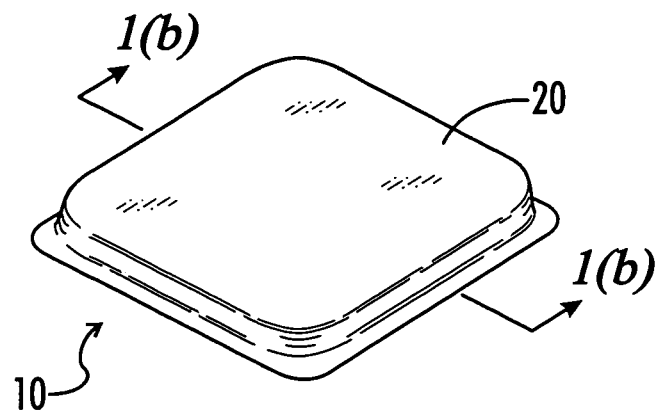
FIG. 1 is a top perspective view of a sealed thermal interface in accordance with the present invention.

Referring to the drawings in detail, a thermal interface prepared in accordance with the present invention is shown and generally designated by the reference numeral 10. It should be noted that for the sake of clarity not all the components and elements of interface 10 may be shown and/or marked in all the drawings. Also, as used in this description, the terms "up," "down," "top," "bottom," etc. refer to thermal interface 10 when in the orientation shown in FIG. 1(a). However, the skilled artisan will understand that thermal interface 10 can adopt any particular orientation when in use.

Thermal interface 10 is intended to be used to facilitate the dissipation of heat from a heat source, more particularly from an electronic component (not shown). The electronic component can comprise any electronic device or component that produces sufficient heat to interfere with the operation of the electronic component or the system of which the electronic component is an element, if not dissipated. The electronic component can comprise a microprocessor or computer chip, an integrated circuit, control electronics for an optical device like a laser or a field-effect transistor (FET), or components thereof, or other like electronic element. The electronic component includes at least one surface from which heat radiates and which can be used as a source of heat to be dissipated from the electronic component.

Referring now to the drawings, one principal function of thermal interface 10 is to form a sufficient operative connection with the external surface of the electronic component without the need for the exertion of undesirably high amounts of pressure. Depending on the nature of the other constituents of a thermal management system employed, such as a heat sink or a heat pipe (not shown), a second function of thermal interface 10 can be to increase the effective surface area of the external surface of the electronic component, to facilitate heat dissipation from it.

To that end, thermal interface 10 preferably comprises an anisotropic flexible graphite sheet. By an anisotropic flexible graphite sheet is meant a sheet of compressed, exfoliated graphite, especially natural graphite. Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes.

Graphite starting materials suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as carbons prepared by chemical vapor deposition and the like. Natural graphite is most preferred.

The graphite starting materials used in the present invention may contain non-carbon components so long as the crystal structure of the starting materials maintains the required degree of graphitization and they are capable of exfoliation. Generally, any carbon-containing material, the crystal structure of which possesses the required degree of graphitization and which can be intercalated and exfoliated, is suitable for use with the present invention. Such graphite preferably has an ash content of less than about twenty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 150 pph and more typically about 50 to about 120 pph. After the flakes are intercalated, any excess solution is drained from the flakes and the flakes are water-washed. Alternatively, the quantity of the intercalation solution may be limited to between about 10 and about 50 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1, 10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_nCOOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2–12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 20 hours, with shorter heating periods, e.g., at least about 10 minutes, for higher temperatures in the above-noted range. Times of one half hour or less, e.g., on the order of 10 to 25 minutes, can be employed at the higher temperatures.

The thus treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into flexible sheets that, unlike the original graphite flakes, can be formed and cut into various shapes and provided with small transverse openings by deforming mechanical impact as hereinafter described.

Flexible graphite sheet and foil are coherent, with good handling strength, and are suitably compressed, e.g. by roll-pressing, to a thickness of about 0.075 mm to 3.75 mm and a typical density of about 0.1 to 1.5 grams per cubic centimeter (g/cc). From about 1.5–30% by weight of ceramic additives can be blended with the intercalated graphite flakes as described in U.S. Pat. No. 5,902,762 (which is incorporated herein by reference) to provide enhanced resin impregnation in the final flexible graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

The flexible graphite sheet can also, at times, be advantageously treated with resin and the absorbed resin, after curing, enhances the moisture resistance and handling strength, i.e. stiffness, of the flexible graphite sheet. Suitable resin content is at least about 5% preferably about 10 to 35% by weight, suitably up to about 60% by weight. Most preferably, however, the flexible graphite sheet has no ceramic particles contained therein, and is not treated with resin, in order to avoid dilution of the desired thermal characteristics of the sheet.

Once formed, the flexible graphite sheet can be cut into the desired shape to be used as thermal interface 10. When cut, thermal interface 10 has two major surfaces 12 and 14, as well as four edge surfaces 16a, 16b, 16c, 16d if thermal interface is square in shape (as would be apparent, when thermal interface 10 is cut into other than a square shape, such as a round shape or a more complex shape, it will have different numbers of edge surfaces 16).

Referring now to FIGS. 1–3(a), thermal interface 10 also comprises a protective coating 20, to forestall the possibility of graphite particles flaking from, or otherwise being separated from, the flexible graphite sheet which makes up thermal interface 10. Protective coating 20 also advantageously effectively isolates thermal interface 10, to avoid electrical interference engendered by the inclusion of an electrically conductive material (graphite) in an electric device. Protective coating 20 can comprise any suitable material sufficient to prevent the flaking of the graphite material and/or to electrically isolate the graphite, such as a thermoplastic material like polyethylene, a polyester or a polyimide.

Advantageously, protective coating 20 is applied in a layer thin enough to avoid degrading the heat dissipation function of thermal interface 10. In other words, since protective coating 20 is formed of a material that does not have the thermal dissipation characteristics of flexible graphite, protective coating 20 is applied such that it is not so thick as to interfere substantially with the heat dissipation afforded by thermal interface 10. To that end, protective coating should be no more than about 0.025 millimeters thick, preferably no more than about 0.005 millimeters thick. Although there is no true minimum thickness for protective coating 20, to achieve the desired flake-resistance and/or electrical isolation, protective coating 20 should preferably be at least about 0.001 millimeters thick.

When thermal interface 10 is applied to the electrical component for which it is providing its heat dissipation function, major surface 12 of thermal interface 10 is that surface which is in operative contact with the electrical component. As such, in many applications, the contact between major surface 12 and the electrical component will function to "seal" major surface 12 against graphite flaking, thus eliminating the need to coat major surface 12 with protective coating 20. Likewise, provided major surface 14 is electrically isolated from the rest of the electrical device in which thermal interface 10 is located, there is no need to electrically isolate major surface 12 to electrically isolate thermal interface 10.

Figure 1A:
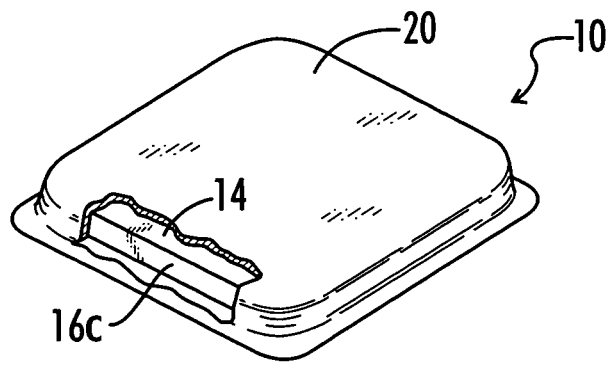
FIG. 1(a) is a partially-broken away top perspective view of the thermal interface of FIG. 1.
Figure 1B:
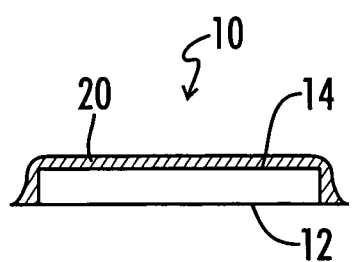
FIG. 1(b) is a cross-sectional side plan view of the thermal interface of FIG. 1, taken along lines-1b—1b-.

Thermal interface 10, having protective coating 20 thereon, can be manufactured by several different processes. For instance, once the flexible graphite sheet is cut to size and shape to form thermal interface 10, the material from which protective coating 20 is formed can be coated on the individual thermal interface 10 so as to flow completely about major surface 14 and edge surfaces 16a, 16b, 16c, 16d and extend beyond edge surfaces 16a, 16b, 16c, 16d to form a protective flaking boundary about thermal interface 10, as illustrated in FIGS. 1, 1(a) and 1(b). To that end, protective coating 20 can be applied by various coating methods familiar to the skilled artisan, such as spray coating, roller coating and hot laminating press.

Figure 2:
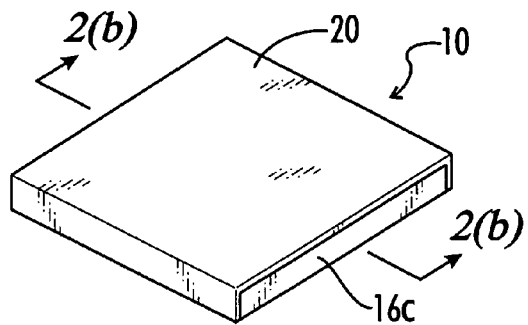
FIG. 2 is a top perspective view of another embodiment of a sealed thermal interface in accordance with the present invention.
Figure 2A:
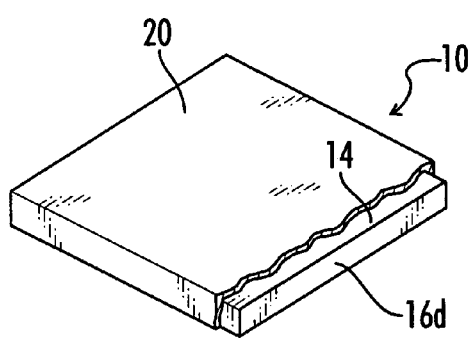
FIG. 2(a) is a partially-broken away top perspective view of the thermal interface of FIG. 2.
Figure 2B:
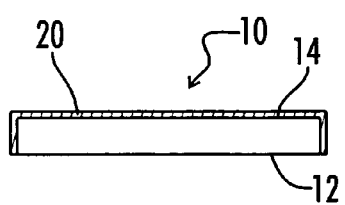
FIG. 2(b) is a cross-sectional side plan view of the thermal interface of FIG. 2, taken along lines-2b—2b-

In an alternative embodiment, illustrated in FIGS. 2, 2(a) and 2(b), protective coating 20 can be applied to thermal interface 10 so as to cover one or more edge surfaces 16a, 16b, 16c, 16d (depending, for instance, on which are exposed and thus subject to flaking and/or electrical interference). Protective coating 20 can be applied by mechanical mapping and lamination to accomplish this.

Figure 3:
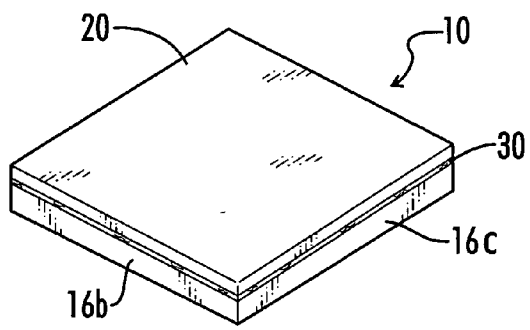
FIG. 3 is a top perspective view of another embodiment of a sealed thermal interface in accordance with the present invention.
Figure 3A:
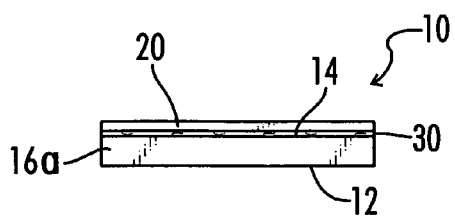
FIG. 3(a) is a side plan view of the thermal interface of FIG. 3.

In yet another embodiment of the present invention, and as shown in FIGS. 3 and 3(a), protective coating 20 is applied to thermal interface 10 so as to coat major surface 14 only. One particularly advantageous way of manufacturing this embodiment of thermal interface 10 is to coat a flexible graphite sheet with protective coating 20, such as by roller coating, laminating with adhesive, or hot press laminating, and then cutting the flexible graphite sheet into the desired shape of thermal interface 10. In this way, manufacturing efficiency is maximized and waste of protective coating 20 minimized in the manufacturing process.

Generally, the coating process adheres protective coating 20 to thermal interface 10 with sufficient strength for most applications. However, if desired, or for relatively non-adhesive protective coatings 20, such as Mylar® polyester materials and Kapton polyimide materials (both commercially available from E. I. du Pont de Nemours and Company of Wilmington, Del.), a layer of adhesive 30 may be applied between thermal interface 10 and protective coating 20, as illustrated by FIGS. 3 and 3(a). Suitable adhesives are those which can facilitate the adhesion of protective coating 20 to thermal interface 10, such as acrylic or latex adhesives. Layer of adhesive 30 can be coated on either or both of thermal interface 10 and protective coating 20. Advantageously, layer of adhesive 30 is as thin as possible while still maintaining adhesion between protective coating 20 and thermal interface 10. Preferably, layer of adhesive 30 is no more than about 0.015 millimeters.

The above description is intended to enable the person skilled in the art to practice the invention. It is not intended to detail all of the possible variations and modifications that will become apparent to the skilled worker upon reading the description. It is intended, however, that all such modifications and variations be included within the scope of the invention that is defined by the following claims. The claims are intended to cover the indicated elements and steps in any arrangement or sequence that is effective to meet the objectives intended for the invention, unless the context specifically indicates the contrary.

What is claimed is:

1. An isolated thermal interface comprising a sheet of compressed particles of exfoliated graphite, the sheet having two major surfaces and at least one edge surface, the major surfaces and at least one edge surface being coated with a protective coating sufficient to inhibit flaking of the particles of graphite.

2. The thermal interface of claim 1 wherein the protective coating comprises a thermoplastic material.

3. The thermal interface of claim 2 wherein the thermoplastic comprises polyethylene, a polyester or a polyimide.

4. The thermal interface of claim 1 wherein the protective coating is no more than about 0.025 millimeters in thickness.

5. The thermal interface of claim 1 wherein the protective coating is effective to electrically isolate the coated major surface of the sheet.

6. The thermal interface of claim 1 which further comprises a layer of adhesive interposed between the protective coating and the sheet.

7. The thermal interface of claim 6 wherein the adhesive is selected from the group consisting of acrylic and latex materials.

8. The thermal interface of claim 6 wherein the layer of adhesive is no more than about 0.015 millimeters in thickness.

9. A process for producing a thermal interface having protective coating sufficient to inhibit flaking of the particles of graphite, the process comprising (a) forming a sheet comprising compressed particles of exfoliated graphite, into the size and shape desired for a thermal interface, wherein the formed sheet has two major surfaces and at least one edge surface, and wherein the sheet has its directions of greater thermal conductivity parallel to the major surface; and (b) coating the major surfaces of the formed sheet with a material to form a protective coating, such that the material forms a protective boundary about the sheet wherein the material is coated on the formed sheet so as to flow completely about at least one of the edge surfaces of the sheet, and extend beyond at least one of the edge surfaces of the sheet.

10. The process of claim 9 wherein the material is coated on the formed sheet by spray coating, roller coating or hot laminating press.

11. The process of claim 9 wherein the material is coated on the formed sheet by roller coating, laminating with adhesive, or hot press laminating, and then cutting the formed sheet into the desired size and shape of the thermal interface.

12. The process of claim 9 wherein the material comprises a thermoplastic material.

13. The process of claim 12 wherein the material comprises polyethylene, a polyester or a polyimide.

14. The process of claim 9 wherein the material is no more than about 0.025 millimeters in thickness.

15. The process of claim 9 wherein an adhesive is coated on the formed sheet between the material and the formed sheet.

16. The process of claim 15 wherein the adhesive comprises an acrylic or a latex material.

17. The process of claim 16 wherein the layer of adhesive is no more than about 0.015 millimeters in thickness.

18. An electronic device comprising
   (a) an electronic component; and
   (b) a thermal interface comprising a sheet of compressed particles of exfoliated graphite having two major surfaces, one of the major surfaces being in contact with the electronic component and the other of the major surfaces coated with a protective coating sufficient to inhibit flaking of the particles of graphite.

19. The device of claim 18 wherein the protective coating comprises a thermoplastic material.

20. The device of claim 19 wherein the thermoplastic comprises polyethylene, a polyester or a polyimide.

21. The device of claim 18 wherein the protective coating is no more than about 0.025 millimeters in thickness.

22. The device of claim 18 wherein the protective coating is effective to electrically isolate the coated major surface of the sheet of flexible graphite particles.

23. The device of claim 18 wherein the graphite sheet has edge surfaces, and at least one edge surface of the sheet of compressed particles of exfoliated graphite is coated with a protective coating sufficient to inhibit flaking of particles of graphite.

* * * * *